United States Patent [19]

Partin et al.

[11] Patent Number: 5,153,557
[45] Date of Patent: Oct. 6, 1992

[54] MAGNETIC FIELD SENSOR CONTACTS

[75] Inventors: Dale L. Partin, Romeo; Joseph P. Heremans, Troy, both of Mich.

[73] Assignee: General Motors Corporation, Detroit, Mich.

[21] Appl. No.: 654,130

[22] Filed: Jan. 28, 1991

[51] Int. Cl.$^5$ ............................................. H01L 43/00
[52] U.S. Cl. .................................................. 338/32 R
[58] Field of Search ........................... 338/32 R, 32 H; 324/207.21, 244, 252

[56] References Cited

U.S. PATENT DOCUMENTS

| | | | |
|---|---|---|---|
| 4,251,795 | 2/1981 | Shibasaki et al. | 338/32 R |
| 4,401,966 | 8/1983 | Ohmura et al. | 338/32 R |
| 4,568,905 | 2/1986 | Suzuki et al. | 338/32 R |
| 4,587,509 | 5/1986 | Pitt et al. | 338/32 H |
| 4,926,154 | 5/1990 | Heremans et al. | 338/32 R |
| 4,939,456 | 7/1990 | Morelli et al. | 324/207.21 |
| 4,978,938 | 12/1990 | Partin et al. | 338/32 R |

OTHER PUBLICATIONS

S. Kataoka, "Recent Development of Magnetoresistive Devices and Applications," *Circulars of the Electrotechnical Laboratory* No. 182, Agency of Industrial Science and Technology, Tokyo (Dec. 1974).
H. H. Wieder, "Transport coefficients of Indium Arsenide epilayers," *Applied Physics Letters*, vol. 25, No. 4, pp. 206–208 (Aug. 15, 1974).
G. Burns, *Solid State Physics* Sections 18-5 and 18-6, pp. 726–747, Academic Press, Inc., Harcourt Brace Jovanovich, Publishers, New York, 1985.
H. P. Baltes and R. S. Popovic, "Integrated Semiconductor Magnetic Field Sensors," *Proceedings of the IEEE*, vol. 74, No. 8, pp. 1107–1132 (Aug. 1986).
S. Kalem, J.-I. Chyi and H. Morkoc, "Growth and transport properties of InAs epilayers on GaAs," *Applied Physics Letters*, vol. 53, No. 17, pp. 1647–1649 (Oct. 24, 1988).
H. Reisinger, et al., "Magnetoconductance study of accumulation layers on n-InAs," *Physical Review B*, The American Physical Society, vol. 24, No. 10, pp. 5960–5969, Nov. 15, 1981.
R. J. Wagner et al., "Magneto-Transconductance Study of Surface Accumulation Layers in InAs," *Surface Science* 73, North-Holland Publishing Company, pp. 545–546, 1978.
R. J. Wagner et al., "Magneto-Transconductance Study of Surface Accumulation Layers in InAs," Physics of Narrow Gap Semiconductors, Proceedings of the III International Conference, Sep. 12–15, 1977, PWN--Polish Scientific Publishers, pp. 427–432.
L. D. Zhu, et al., "Two-dimensional electron gas in $In_{0.53}Ga_{0.47}As/InP$ heterojunctions grown by atmospheric pressure metalorganic chemical-vapor deposition," *J. Appl. Phys.*, 58(8), pp. 3145–3149, Oct. 15, 1985.
D. C. Tsui, "Observation of Surface Bound State and Two-Dimensional Energy Band by Electron Tunneling," *Physical Review Letters*, vol. 24, No. 7, pp. 303–306, Feb. 16, 1970.
D. C. Tsui, "Electron-Tunneling Studies of a Quantized Surface Accumulation Layer," *Physical Review B*, vol. 4, No. 12, pp. 4438–4449, Dec. 15, 1971.
D. C. Tsui, "Landau-level spectra of conduction electrons in an InAs surface," *Physical Review B*, vol. 12, No. 12, pp. 5739–5748, Dec. 15, 1975.
T. C. Harman, et al., "Electrical Properties of n-Type InAs," *Physical Review*, vol. 104, No. 6, pp. 1562–1564, Dec. 15, 1956.
R. F. Wick, "Solution of the Field Problem of the Germanium Gyrator," *Journal of Applied Physics*, vol. 25, No. 6, pp. 741–756, Jun., 1954.

*Primary Examiner*—Marvin M. Lateef
*Attorney, Agent, or Firm*—Robert J. Wallace

[57] ABSTRACT

A magnetic field sensor, such as a magnetoresistor, Hall effect device or magnetotransistor, comprising an active layer of indium antimonide on the surface of a substrate having a length substantially greater than its width. A conductive contact is on the active layer at each end thereof and a plurality of shorting bar contacts are on the active layer and spaced along the length of the active layer between the end contacts. The contacts are each of a thin layer of a highly conductive n-type conductivity semiconductor material which has a low sheet resistivity and a low contact resistance with the active layer. A layer of a conductive metal may be provided on the semiconductor material layer of the contact, and a thin layer of highly conductive n-type indium antimonide may be provided between the semiconductive material layer and the active layer.

16 Claims, 1 Drawing Sheet

MAGNETIC FIELD SENSOR CONTACTS

FIELD OF THE INVENTION

The present invention relates to a contact for a magnetic field sensor semiconductor layer and, more particularly, to a contact for a magnetic field sensor formed of a layer of indium antimonide (InSb).

BACKGROUND OF THE INVENTION

Magnetoresistors are devices whose resistance varies with a magnetic field applied to the device and are therefore useful for magnetic field sensors. Hall effect devices and a gateless version of the split drain magnetotransistor are related magnetic field sensors which can be made with the same fabrication technology. The magnetoresistor is useful for position sensing applications and may be useful for a variety of other applications, such as brushless motors or magnetic memory storage readout devices. Initially, magnetoresistors were believed to be best formed from high carrier mobility semiconductor materials in order to obtain the highest magnetic sensitivity. Therefore, the focus was on making magnetoresistors from bulk materials that were thinned down or on films having sufficient thickness to exhibit a high average mobility. However, as described in the copending U.S. patent application of D. L. Partin et al., Ser. No. 07/426,245, filed Oct. 25, 1989 entitled, "Magnetoresistor," and assigned to the same assignee as the present application, good magnetoresistors can be made of an extremely thin film of a semiconductor material having an accumulation layer induced in the surface of the film. Semiconductor materials which have been found satisfactory for making such magnetoresistors include indium antimonide. Such magnetoresistors comprise a thin film of the semiconductor material on the surface of a substrate of an insulating material, preferably a semiconductor material having a lattice constant close to that of the semiconductor material of the thin film so as to be able to obtain a film of good crystalline quality. The film is defined to be in the form of a relatively narrow strip having a length substantially greater than its width. Conductive contacts are provided on the film at the ends thereof, and shorting bars of a conductive material are on the film spaced apart along the length of the strip to divide the strip into a plurality of active regions of the appropriate size.

It is important to obtain high crystalline quality of the semiconductor material film in order to have high electron mobility, which produces high sensitivity to magnetic fields. It has been found that another important aspect of the magnetoresistor is the specific contact resistance ($r_c$) between the semiconductor material film and the contacts and shorting bars. The actual resistance of such a contact ($R_c$) is determined by dividing the specific contact resistance ($r_c$) by the area of the contact or shorting bar. The conductive shorting bars can be thought of as periodically shorting out the Hall electric field of the semiconductor film. To do this, the conductive shorting bar must have a low sheet resistance ($R_s$) relative to the semiconductor material film, and must have a low resistance. The importance of having very low sheet resistance and actual resistance can be appreciated from the fact that there are generally many such contacts in series along a strip of the semiconductor material film, and such (electrical contact) resistances are insensitive to magnetic field.

Although good (low resistance) contacts have been made easily to a number of the semiconductor materials which have been used for magnetoresistors, such as gallium arsenide (GaAs) and indium arsenide (InAs), it has been found that making good contacts to indium antimonide (InSb) is a problem. This was unexpected since, other things being equal, it is generally true that the smaller the energy band gap (Eg) is of a semiconductor material, the smaller the energy barrier is at a contact to it and, therefore, the lower the specific resistance, $r_c$. Contacts to n-type conductivity gallium arsenide (Eg=1.4 eV) have been previously made using multi-layers of Au-Ge or In-Sn followed by a high temperature alloying step. Contacts to indium arsenide (Eg=0.36 eV) with negligible resistance were easily obtained using gold, tin or indium, with no high temperature annealing required. Since indium antimonide has a very small energy band gap, 0.18 eV, it was believed that there would be no problem in forming a low resistance contact to it. However, we have found that Au and Au-Ge metallization systems are inadequate for the highest performance InSb magnetoresistor. Indium based alloys, such as In-Sn, generally have melting points which are too low for some practical device environments, such as certain automotive applications which require operating temperatures up to 200° C. or higher. Therefore, it is desirable to have a contact for a thin film indium antimonide magnetoresistor which has low sheet resistance, low contact resistance, will withstand the high temperatures at which the magnetoresistor may be used and which can be easily made.

SUMMARY OF THE INVENTION

The present invention relates to a magnetic field sensor, such as a magnetoresistor, formed of a thin active film of indium antimonide having at least one contact thereon. The contact may be a termination contact at the ends of the film or shorting bars spaced along the length of the film between the termination contacts. The contact comprises a thin layer of an n-type conductivity semiconductor material which is highly conductive so as to have a low sheet resistance and a low contact resistance with the indium antimonide film. A thin film of highly doped indium antimonide may be provided between the active film and the contact film, and a highly conductive metal film may be provided over the contact film.

More particularly, the present invention relates to a magnetic field sensor comprising a substrate having a surface and a thin film of indium antimonide on the substrate surface. At least one contact is on the indium antimonide film. The contact comprises a thin film of an n-type conductivity semiconductor material which is highly conductive so as to have a low sheet resistance and a low contact resistance with the indium antimonide film.

The invention will be better understood from the following more detailed description taken with the accompanying drawings.

It should be understood that the drawings are not necessarily drawn to scale.

DETAILED DESCRIPTION

Figure 1:
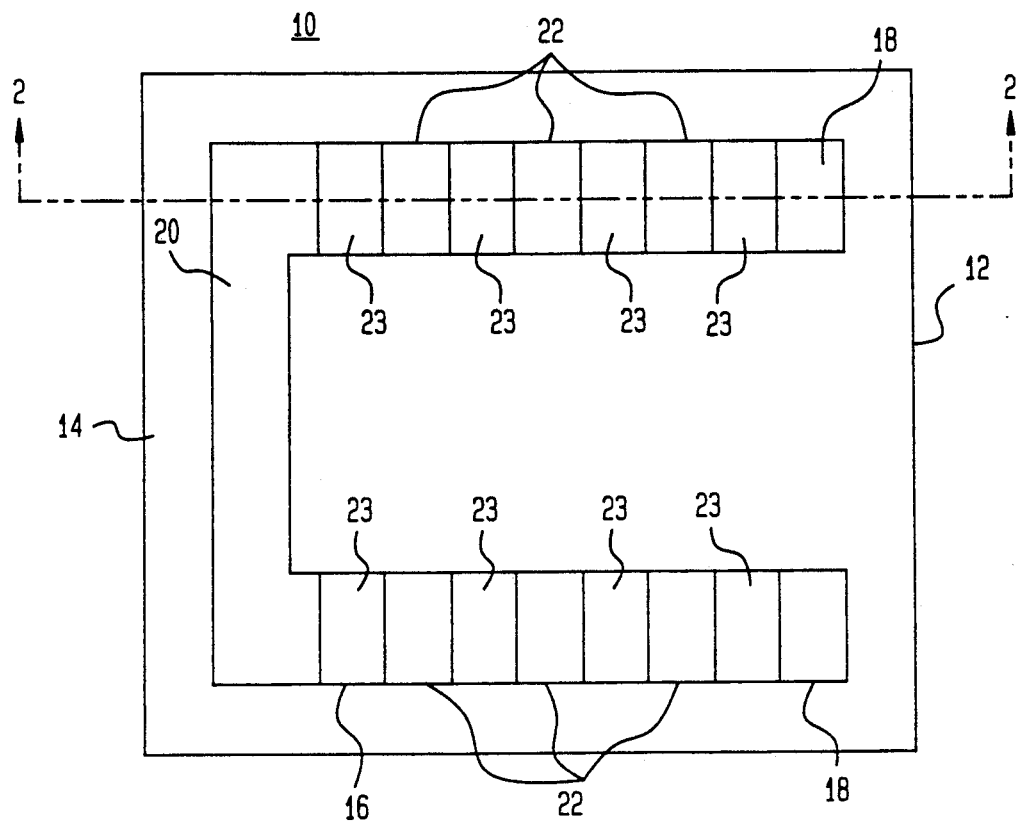
FIG. 1 is a top plan view of a magnetoresistor which incorporates the contact of the present invention.
Figure 2:
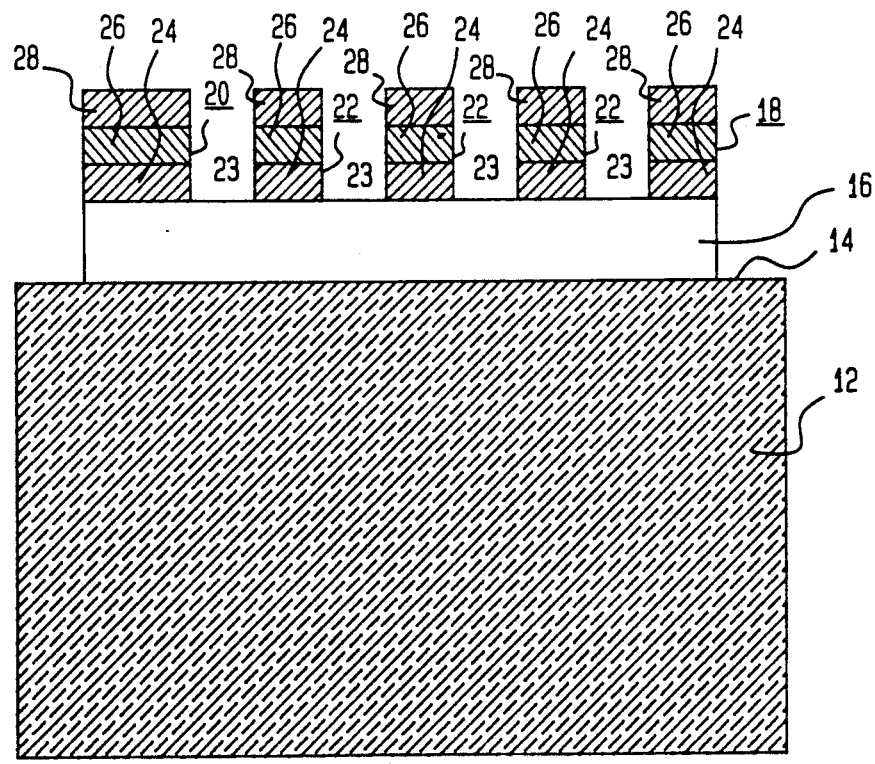
FIG. 2 is a sectional view taken along line 2—2 of FIG. 1.

Referring to the drawings in which FIG. 1 is a top plan view and FIG. 2 is a sectional view there is shown one form of a magnetoresistor 10 of the present invention. Magnetoresistor 10 comprises a substrate 12 having a surface 14 and a magnetoresistor active film 16 on the substrate surface 14. The substrate 12 is preferably of an insulating material (e.g., gallium arsenide (GaAs) or indium phosphide (InP)) on which the active film can be readily formed. The active film 16 is of lightly doped n-type conductivity (typically doped at $2 \times 10^{16}$ to $7 \times 10^{17}$ carriers/cm$^3$) indium antimonide (InSb) of a thickness of no greater than 5 micrometers and preferably no greater than 3 micrometers. The indium antimonide active film 16 can be epitaxially grown on the substrate surface 14, such as by metal organic chemical vapor deposition (MOCVD) or molecular beam epitaxy (MBE), both techniques being well known in the art. As shown in FIG. 1, the active film 16 is narrow, and extends in a U-shaped path so as to have a length substantially greater than its width. However, the active film 16 can be straight or extend in any desired meandering pattern depending on the length of the active film desired.

First and second conductive contacts 18 are on the active film 16 at the ends thereof. A third conductive contact 20 is shown on the active film 16 along the base of the U-shaped active film 16. The third contact 20 is only required if the magnetoresistor 10 is to be formed as part of a dual magnetoresistor. However, this third contact 20 is optional and can be left off. Conductive shorting bars 22 are on the active film 16 and are spaced therealong between the contacts 18. The shorting bars 22 divide the active film 16 into a plurality of active areas 23 which are connected in series through the shorting bars 22. As described in U.S. Pat. No. 4,926,154 to J. P. Heremans et al., issued May 15, 1990 entitled, "Indium Arsenide Magnetoresistor," the shorting bars 22 are spaced apart a distance to form active areas 24 of the desired size and shaped to achieve good magnetoresistor properties. As used hereinafter, the term "contact" will refer to the shorting bars 22 as well as the contact 18 and 20.

Referring to FIG. 2, each of the contacts 18, 20 and 22 comprises a first layer 24 of highly doped n-type conductivity (N+ type) indium antimonide directly on the active film 16. The first layer 24 is preferably doped to a level of $3 \times 10^{17}$ to $1 \times 10^{18}$ carriers/cm$^3$. On the first layer 24 is a second layer 26 of a highly doped n-type conductivity (N+ type) semiconductor material. The second layer 26 is preferably doped to a level of at least $10^{18}$ carriers/cm$^3$. The semiconductor material for the second layer 26 is preferably one having a lattice constant which is the same as or slightly higher than and within a few percent of that of indium antimonide in order to achieve good crystal growth of the semiconductor material on the first layer 24, such as gallium antimonide GaSb). However, gallium arsenide GaAs can also be used. Also, the second layer 26 can be of a semimetal, such as bismuth (Bi), antimony (Sb) or alloys there of, such as Bi$_{1-x}$Sb$_x$, may also be used and hereinafter will be considered to be included in the term "semiconductor." In addition, alloys or multi-layered combinations of these materials may be used for the second layer 26. On the second layer 26 is a third layer 28 of a conductive metal which makes a good ohmic contact with the semiconductor material of the second layer 26 and which will withstand the temperatures at which the magnetoresistor 10 may be used. Suitable metals are gold or gold germanium alloys in multi-layered combination with other metals which adhere well to the semiconductor material. For example, a 500 Angstrom thick layer of a gold and germanium alloy containing by weight 12% germanium is applied directly to the semiconductor material layer 26 followed by a 500 Angstrom thick layer of nickel and finally a 5000 Angstrom thick layer of gold. These contacts are ultimately heated briefly at 300° C. to 400° C. to improve the contact resistance. Another metal combination which is suitable for the third layer 28 is a 500 Angstrom thick layer of titanium on the second layer 26, followed by a 500 Angstrom thick layer of platinum or palladium and finally a 5000 Angstrom thick layer of gold. The first and second layers 24 and 26 are relatively thin, 100 to 2000 Angstroms and are highly doped to make them highly conductive. Dopants such as silicon, tin, sulfur, selenium and tellurium are suitable for indium antimonide, gallium antimonide, and gallium arsenide, whereas only sulfur, selenium and tellurium are suitable for the bismuth-antimony alloys. The third layer 28 is relatively thick, 0.3 to 2 micrometers, so as to be highly conductive.

To form the contact of the present invention, a layer of N+ type indium antimonide is first epitaxially deposited on the active layer 16 and a layer of the desired semiconductor material for the second layer 26 is epitaxially deposited on the indium antimonide layer. These layers may be deposited by the same epitaxial technique used to deposit the active layer 16. The two layers are preferably doped during the deposition process. However, they may be deposited undoped, and then later doped using ion implantation followed by an annealing process. The two layers may then be defined to form the contacts followed by depositing the metal third layer 28 on the contacts. The two layers may be defined by forming a masking layer, such as of a photoresist, over the portions of the second layer which are to form the contacts. The uncovered portions of the two layers are then removed with a suitable etching technique, such as by ion beam or wet chemical etching. Since the two layers are relatively thin, they can be readily and quickly removed. The metal third layer 28 can be deposited by any well-known technique for the particular metal used, such as by evaporation in a vacuum or sputtering. Alternatively, the metal third layer 28 can be deposited on the second layer 26 before the first and second layers 24 and 26 are defined. The metal third layer 28 can then be defined, such as by a selective etching process or by a photolithographic lift-off process, so that the metal third layer 28 is patterned to extend over the portions of the first and second layers 24 and 26 which are to form the contacts. The metal third layer 28 is then used as a mask to etch the second and first layers 26 and 24 and form the contacts. Etching the second and first layers 26 and 24 is unnecessary if they are thin enough to have a very small lateral conductivity or sheet resistance relative to that of layer 16.

In the contact of the present invention for the magnetoresistor 10, the highly conductive indium antimonide first layer 24 provides a layer of high conductivity which has a low resistance contact with the indium antimonide active layer 16. The highly conductive semiconductor second layer 26 also provides a layer of high conductivity which has a low resistance contact with the highly conductive indium antimonide first layer 24. The second layer 26 is also of a semiconductor material to which a conductive metal third layer 28 can have a low resistance contact. In addition, the metals which can be used for the third layer 28 which make a low resistance contact with the second layer 26 and which are themselves highly conductive, will withstand the high temperatures to which the magnetoresistor 10 may be subjected. Thus, the contact of the present invention, which may be the shorting bars 22 or the contacts 18 and 20, has a low resistance so as to be highly conductive, provides a low resistance contact to the indium antimonide active layer 16, and which will withstand the high temperatures to which the magnetoresistor 10 may be subjected.

Although the contact of the present invention has been described as being formed of three layers, it is possible to eliminate the second highly conductive layer 26 of semiconductor indium antimonide without unacceptably degrading device performance for some applications. This is desirable since growth of a different semiconductor material (e.g., GaSb) is thereby eliminated. This two layer contact system works best if the n-type indium antimonide layer 24 is doped at about $1 \times 10^{18}$ carriers/cm$^3$ or higher.

Thus, there is provided by the present invention a contact for a magnetoresistor or other similar magnetic field sensor having an indium antimonide active layer. The contact has a highly doped layer of a semiconductor material which has a low resistance so as to be highly conductive, which has a low resistance contact to the active layer and which will withstand high temperatures to which the magnetoresistor may be subjected during use. A highly conductive layer of N-type indium antimonide may be provided between the semiconductor material layer and the active layer to further decrease the contact resistance. Also, a layer of a conductive metal may be provided over the semiconductor material layer to further decrease the resistance of the contact and to provide for ease of attaching a terminal or the like to the contact. The contact may be used as a shorting bar or an end contact of the magnetoresistor.

It is to be appreciated and understood that the specific embodiments of the invention are merely illustrative of the general principles of the invention. Various modification may be made consistent with the principles set forth. For example, various materials may be used for the substrate as long as the material permits the indium antimonide active layer to be readily epitaxially deposited thereon, and as long as the substrate does not electrically short out the active layer. Also, the present invention is applicable to magnetic field sensors other than magnetoresistors, e.g., a split drain magnetotransistor of the type described by H. P. Balter and R. S. Popovic in Procedures of IEEE, vol. 74, pages 1107–1132, 1986.

The embodiments of the invention in which an exclusive property or privilege is claimed are defined as follows:

1. A magnetic field sensor comprising:
a substrate having a surface;
an active layer of indium antimonide on said substrate surface;
a conductive contact on said active layer, said contact comprising a thin layer of an n-type conductivity semiconductor material which is highly conductive so as to have a low sheet resistance and a low contact resistance with the active layer, wherein the semiconductor material of the contact has a lattice constant close to that of indium antimonide; and
a thin layer of a highly doped n-type indium antimonide between the semiconductor material and the active layer.

2. The magnetic field sensor of claim 1 further comprising a layer of a conductive metal on the semiconductor material layer.

3. The magnetic field sensor of claim 2 further comprising a thin layer of highly doped n-type indium antimonide between the semiconducor material layer and the active layer.

4. The magnetic field sensor of claim 1 in which the semiconductor material layer and the highly doped indium antimonide layer of the contact are each of a thickness of between 100 and 2000 Angstroms.

5. The magnetic field sensor of claim 4 in which the active layer is of a thickness of no greater than 5 micrometers.

6. A magnetoresistor comprising:
a substrate having a surface;
a narrow active layer of n-type conductivity indium antimonide on said substrate surface having a length substantially greater than its width;
a conductive contact on said active layer at each end thereof; and
a plurality of shorting bar contacts on said active layer spaced along the length of the active layer between the end contacts;
each of said shorting bar contacts comprising a thin layer of an n-type conductivity semiconductor material which is highly conductive so as to have a low sheet resistance and a low contact resistance with the active layer, wherein the semiconductor material of the contact has a lattice constant close to that of indium antimonide; and
a thin layer of highly doped n-type indium antimonide between the semiconductor material layer and the active layer.

7. The magnetoresistor of claim 6 further comprising a layer of a conductive metal on the semiconductor material layer.

8. The magnetoresistor of claim 6 further comprising a layer of highly doped n-type indium antimonide between the semiconductor material layer and the active layer.

9. The magnetoresistor of claim 8 in which the semiconductor material layer and the highly doped indium antimonide layer of the contact are each of a thickness of between 100 and 2000 Angstroms.

10. The magnetoresistor of claim 8 in which each of the end contacts comprises a layer of the highly conductive n-type semiconductor material on the active layer.

11. The magnetoresistor of claim 10 in which each of the end contacts further comprises a layer of a conductive metal over the semiconductor material layer.

12. The magnetoresistor of claim 11 in which each of the end contacts further comprises a layer of highly conductive n-type indium antimonide between the semiconductor material layer and the active layer.

13. A magnetoresistor comprising:
a substrate having a surface;
a narrow active layer of n-type conductivity indium antimonide on said substrate surface, said active layer having a length substantially greater than its width;

a conductive contact on said active layer at each end thereof;

a plurality of shorting bar contacts on said active layer spaced along the length of the active layer between the end contacts;

each of said end contacts comprising a thin layer of an n-type conductivity semiconductor material which is highly conductive so as to have a low sheet resistance and a low contact resistance with the active layer, wherein the semiconductor material of the contact has a lattice constant close to that of the indium antimonide; and a thin layer of highly doped n-type indium antimonide between the semiconductor material layer of the contact and the active layer.

14. The magnetoresistor of claim 13 further comprising a layer of a conductive metal on the semiconductor material layer of the contact.

15. The magnetoresistor of claim 14 further comprising a thin layer of highly doped n-type indium antimonide between the semiconductor material layer of the contact and the active layer.

16. The magnetoresistor of claim 15 in which the semiconductor material layer and the highly doped indium antimonide layer of the contact are each of a thickness of between 100 and 2000 Angstroms.

* * * * *